United States Patent [19]

Kreft

[11] 4,337,515

[45] Jun. 29, 1982

[54] AUTOMOTIVE ENGINE ANALYZER FOR INDICATING A NO-CONNECTION CONDITION OF ENGINE TEST LEADS

[75] Inventor: Keith A. Kreft, Mt. Prospect, Ill.

[73] Assignee: Sun Electric Corporation, Crystal Lake, Ill.

[21] Appl. No.: 140,585

[22] Filed: Apr. 15, 1980

[51] Int. Cl.³ .............................................. G06F 11/00
[52] U.S. Cl. ................................... 364/551; 364/571; 364/431.03; 364/481; 73/117.2; 324/51
[58] Field of Search ............... 364/551, 424, 431, 579, 364/580, 578, 480, 481, 483, 482; 73/116, 117.1, 117.3, 117.2; 324/73 AT, 51

[56] References Cited

U.S. PATENT DOCUMENTS

| | | | |
|---|---|---|---|
| 3,920,973 | 11/1975 | Avellar et al. | 364/579 |
| 4,027,532 | 6/1977 | Trussell et al. | 364/431 X |
| 4,207,611 | 6/1980 | Gordon | 364/483 X |
| 4,212,075 | 7/1980 | Cleversey et al. | 364/580 |
| 4,218,745 | 8/1980 | Perkins | 364/482 X |
| 4,224,690 | 9/1980 | Rockwell | 364/580 X |
| 4,255,792 | 3/1981 | Das | 364/580 |

Primary Examiner—Edward J. Wise
Attorney, Agent, or Firm—Allegretti, Newitt, Witcoff & McAndrews

[57] ABSTRACT

A voltage divider network comprising three series connected resistors serve to reference a test signal lead connectable to an internal combustion engine, with respect to ground for providing a voltage test signal on an output conductor representative of test data to be retrieved from the engine. Whenever the test signal lead is disconnected from the engine, the voltage divider network provides a non-zero voltage level on the output conductor, having a magnitude lying without a predetermined voltage range of possible test signals. A signal processing circuitry analyzes the test signals for providing a visual analysis display for the operator of the analyzer, and further is responsive to the aforesaid non-zero voltage level for blanking the portion of the visual display which is reserved for displaying analysis data.

10 Claims, 4 Drawing Figures

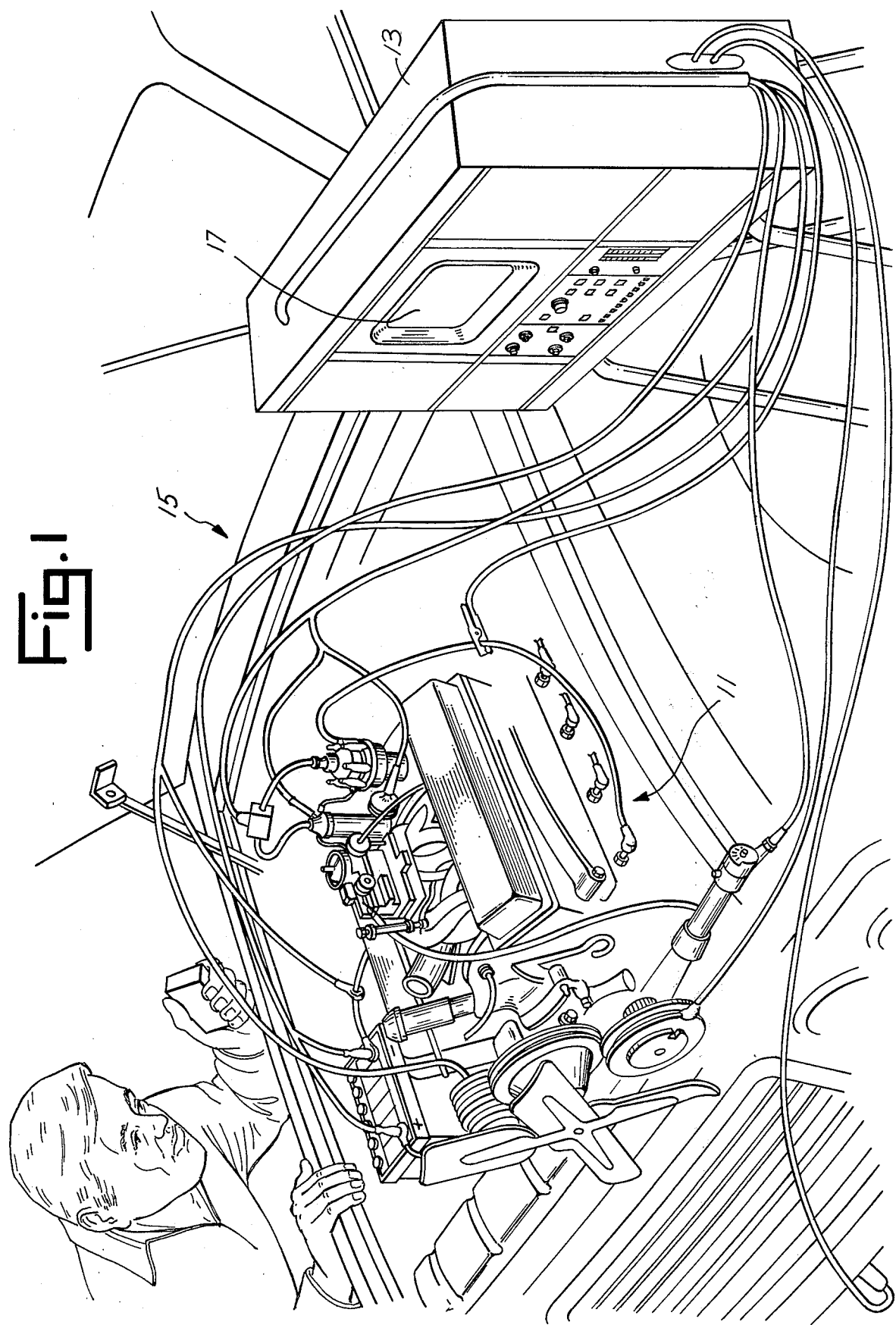

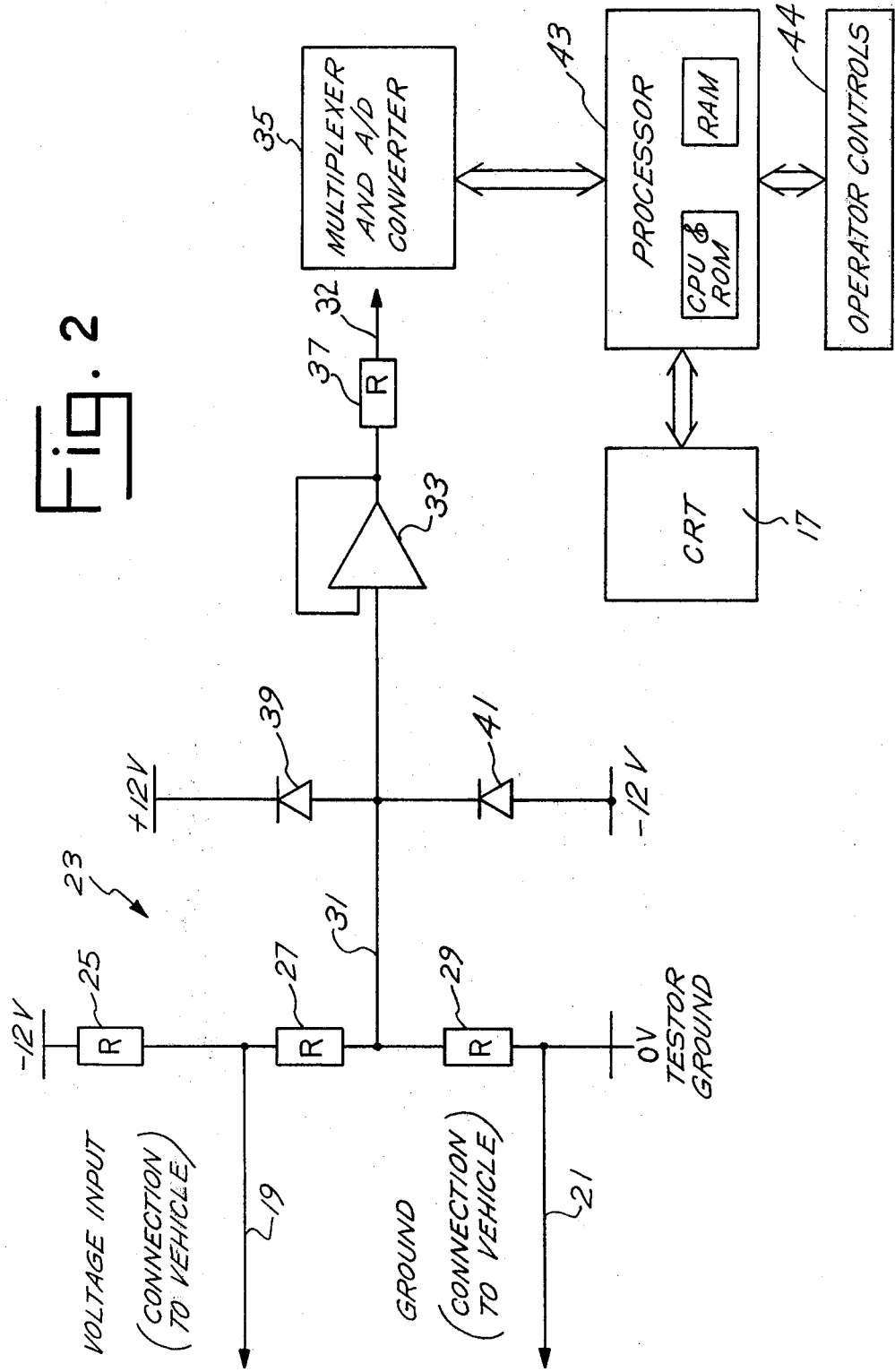

AUTOMOTIVE ENGINE ANALYZER FOR INDICATING A NO-CONNECTION CONDITION OF ENGINE TEST LEADS

BACKGROUND OF THE INVENTION

The invention relates to automotive engine test equipment having a plurality of test leads which are connectable to an engine for monitoring particular operating conditions of the engine in order to provide a visual display indication to the mechanic operator as to the analysis of the operating condition of the engine, and more particularly relates to circuitry utilized to indicate to the operator when a particular test lead of the engine test equipment has become disconnected from the engine.

The servicing of vehicle engines is becoming increasingly important because of road safety considerations and public awareness of automotive emissions on the environment. In addition, the engines of current vehicles are becoming more difficult and complicated to diagnose and analyze.

Much of the test equipment which is available on the market utilizes several test leads which are connected to the engine for retrieving certain data information. In certain cases the particular information to be monitored will be a voltage level lying within a predetermined voltage range. In the event that the test lead was not properly connected to the automotive engine, a zero voltage ordinarily appears, which zero voltage may lie within the predetermined voltage range. In some cases, as for example measuring distributor points drop, the voltage sought after is zero volts.

In such cases, where a zero or near zero voltage reading is obtained, the operator cannot be sure that a lead connection is improperly made or that an accurate voltage condition is actually being sensed. Thus, erroneous conclusions may be drawn.

Therefore, it is an object of the present invention to provide an automotive engine analyzer in which the operator is visually instructed that a test lead has become disconnected from the automotive engine.

It is a further object of the present invention to provide apparatus for generating a non-zero voltage level falling outside of the range of valid test data signals, whenever a lead becomes disconnected from the engine.

SUMMARY OF THE INVENTION

These and other objects of the invention are achieved by referencing the signal received from the engine via a test lead, with respect to a ground lead, at a value which represents the test signal as a voltage level having a magnitude lying within a predetermined range. The voltage signal appearing on the test lead whenever the lead is disconnected from the engine is referenced with respect to the ground lead for providing a non-zero voltage level having a magnitude lying without the aforesaid predetermined range. The non-zero voltage level is monitored by a signal processing circuitry for generating an indication to the mechanic operator that a test lead has become disconnected from the engine.

BRIEF DESCRIPTION OF THE DRAWINGS

FIG. 1 is a perspective view of an internal combustion engine that is connected to a prior art engine analyzer in which a preferred embodiment of the present invention may be utilized.

FIG. 2 is an electrical schematic and block diagram illustrating a preferred embodiment of the invention.

DESCRIPTION OF THE PREFERRED EMBODIMENT

Figure 4:
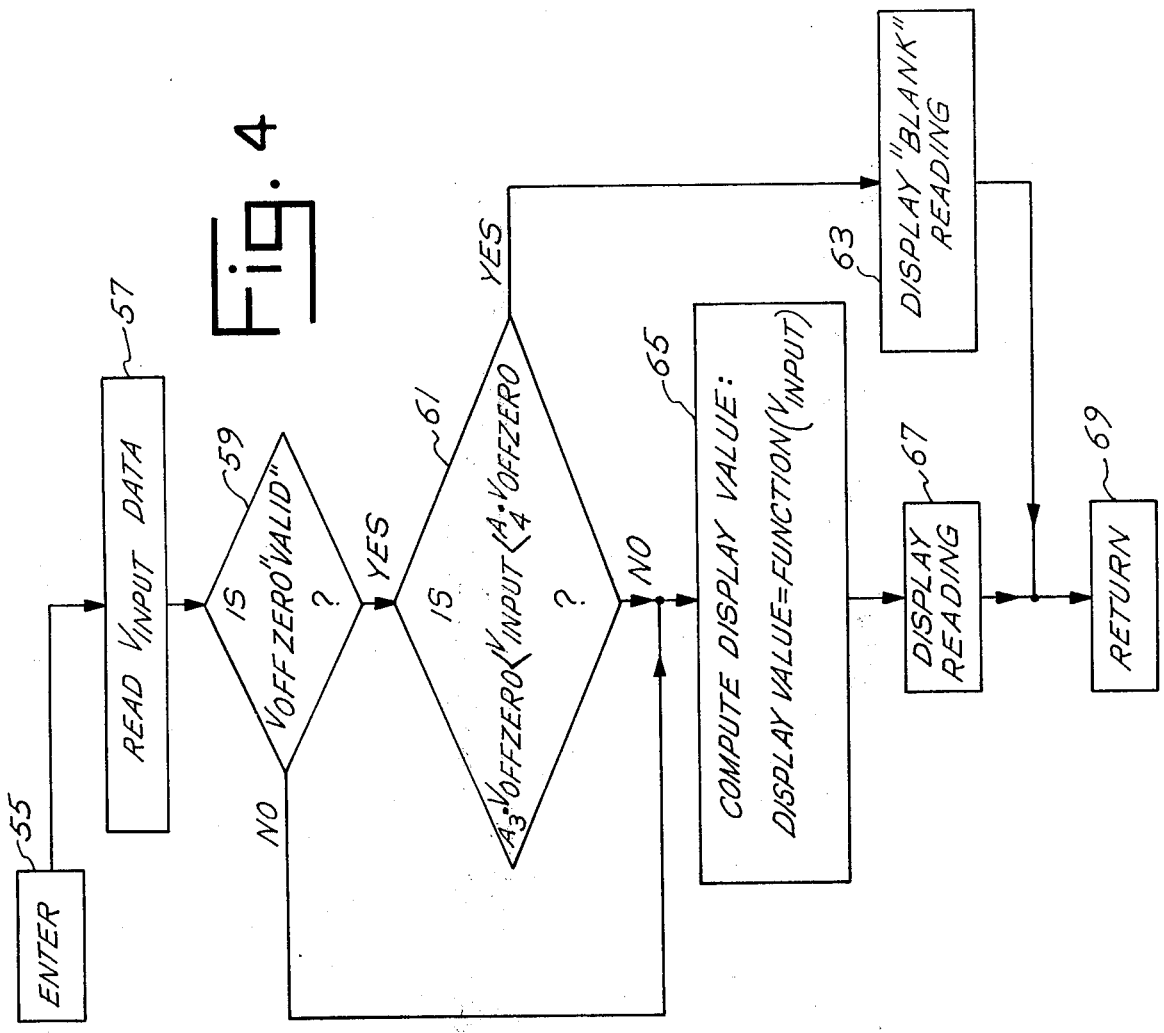
FIG. 4 is a flow diagram of a data acquisition and display routine of the microprocessor of the embodiment of FIG. 1.

Referring to FIG. 1, an exemplary V-8 internal combustion engine 11 is capable of being diagnosed by a prior art engine analyzer 13, a Sun Electric Model No. 2001 Engine Analyzer. Analyzer 13 is described in detail in U.S. Pat. No. 4,125,894 issued to Cashel et al on Nov. 14, 1978 and is incorporated herein by reference. The Cashel Patent is referenced herein to indicate the analyzer environment in which the preferred embodiment may be utilized.

A plurality of engine monitoring leads 15 are connected to engine 11 at a plurality of different locations for retrieving electrical signals indicative of test data to be received by analyzer 13 for processing. Analyzer 13 includes a Cathode Ray Tube (CRT) 17 for visually communicating with the mechanic operator. Various engine operating parameters and analysis information are visually displayed on CRT 17 as the operator conducts different operating test sequences on engine 11, as described in the Cashel patent.

Referring to FIG. 2, a test lead 19 which is one of the leads 15 is connectable to engine 11 for providing an analog signal carrying information to analyzer 13. For example, the primary signal may be monitored by test lead 19 for generating an indication of the points open/points closed condition. As will suggest itself from the following description, the embodiment described with respect to FIG. 2 may be utilized with test leads other than the primary signal lead where appropriate.

A second lead 21 is connected to the engine in order to establish a ground or reference connection. Leads 19, 21 are interconnected to a voltage divider circuitry 23 comprising three series connected resistor 25, 27 and 29. Voltage divider circuit 23 provides a voltage output along a conductor 31 representative of the signal data being retrieved via signal lead 19.

Resistor 25 is connected between negative 12 volts and lead 19; resistor 27 is connected between lead 19 and output conductor 31; and resistor 29 is connected between output lead 31 and ground lead 21. The voltage appearing on test lead 19 is divided by operation of divider circuit 23 to the working level of the electronic circuitry which will process the representative test signals.

The dividend voltage is output along conductor 31 to a voltage follower amplifier 33 which reduces the typically high impedance level established by resistors 27, 29 to a less noise sensitive, lower impedance level. The output of voltage follower amplifier 33 is fed to a multiplexer and A/D converter circuit 35 over a conductor 32 via a resistor 37 which offers protection to amplifier 33 should the voltage output on conductor 32 accidentally be shorted to ground or to a power supply bus. A pair of diodes 39, 41 are connected as shown for providing overvoltage protection for amplifier 35, as is understood.

Multiplexer and A/D converter circuit 35 converts the amplified dividend voltage to a digital data signal for multiplex transmission to a microprocessor 43. Microprocessor 43 manipulates the data signal and displays analysis data onto CRT 17 in the manner described in the Cashel patent.

The prior art Cashel patent includes only resistors 27, 29 (see FIG. 7 of Cashel patent) and does not include resistor 25 nor a connection of resistor 25 to −12 volts; thus, when test lead 19 (primary signal lead) is not making connection with the engine due to possible operator error or a broken conductor, the voltage level established on conductor 31 will be near zero volts and a corresponding voltage will be shown on the CRT 17.

The preferred embodiment, however, includes resistor 25 and a negative 12 volt source connection via resistor 25 to test lead 19. Thus, when test lead 19 is connected to the vehicle, resistor 25 acts as a small load, having no effect on the voltage dividing and display processes of the system. However, when test lead 19 is disconnected from the engine, resistor 25 operates with resistors 27, 29 to establish a non-zero voltage level ($V_{off\,zero}$) on output conductor 31.

Figure 3:
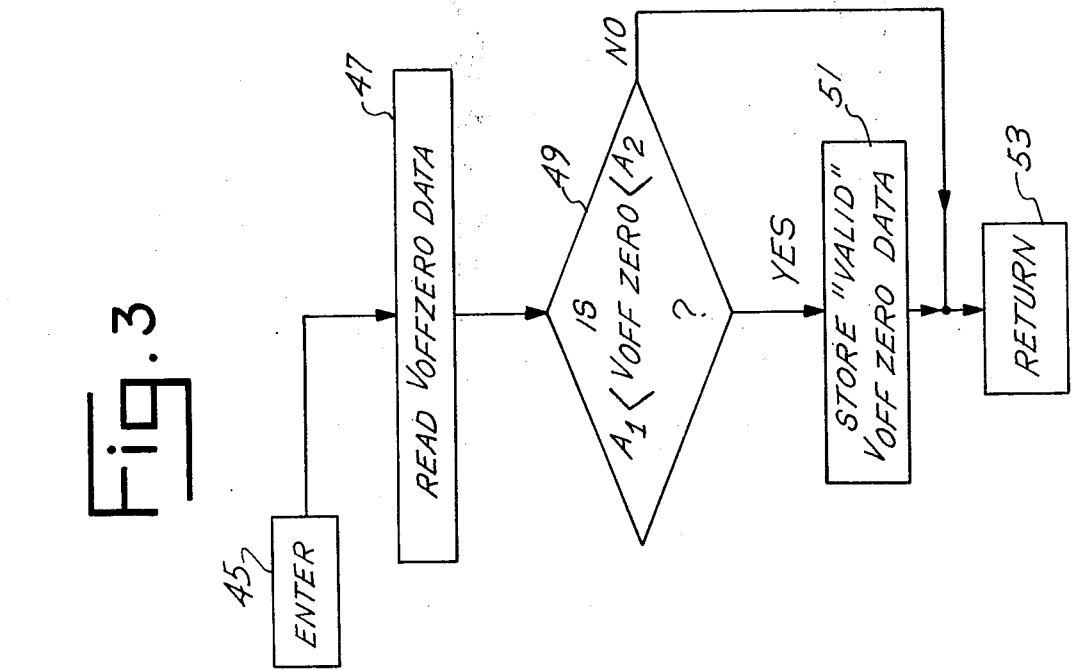
FIG. 3 is a flow diagram illustrating a test lead voltage updating routine of a microprocessor of the embodiment of FIG. 1.

Referring to FIG. 3, a $V_{off\,zero}$ updating routine is illustrated, which is executed by microprocessor 43 for establishing an actual value for $V_{off\,zero}$. The routine of FIG. 3 forms a part of a system calibration routine which is performed after power initialization and may be periodically selected for execution by the operator, via operator controls 44 (FIG. 2), to correct for zero and span drifts of various measuring parameters of the total system.

The updating routine of FIG. 3 includes a plurality of steps 45, 47, 49, 51, 53. The routine is entered at step 45 and the voltage appearing on output conductor 32 is read via multiplexer and A/D converter 35 in step 47. The voltage read at step 47 is then checked at step 49, to determine whether it falls within a range of possible "no connection" $V_{off\,zero}$ conditions as established by resistors 25, 27 and 29 for indicating that test lead 19 is disconnected from engine 11. If the voltage read does in fact fall within the range of $V_{off\,zero}$ conditions, the read voltage is stored to update $V_{off\,zero}$, at step 51. Control is returned to the main program via step 53.

If the $V_{off\,zero}$ reading is not within the range, which is set by a pair of program constants $A_1$, $A_2$, the reading is discarded and control returns to the main program via step 53. This could occur where the test lead 19 is connected during performance of this routine.

Referring to FIG. 4, a data acquisition and display routine is illustrated, which is to be performed by processor 43 every x number of milliseconds. The routine is entered at step 55 and a plurality of steps 57 through 69 are executed.

In step 57, the voltage appearing on output conductor 32, $V_{input}$, is read via multiplexer and A/D converter circuit 35. A check is performed at step 59 to determine whether a valid $V_{off\,zero}$ reading was stored during the calibration routine of FIG. 3. If a valid $V_{off\,zero}$ reading was stored, the program proceeds to step 61; if a valid $V_{off\,zero}$ reading was not stored, the program jumps to step 65.

In step 61, the $V_{input}$ voltage is checked to determine whether it is equal to the stored $V_{off\,zero}$ voltage. A pair of program constants $A_3$, $A_4$ are constants having a value slightly less than one and having a value slightly greater than one, respectively. These constants are used to set an allowed tolerance for this equality check.

If the $V_{input}$ voltage is equal to the stored $V_{off\,zero}$ voltage (within the allowed tolerance), then this indicates a "no connection" condition exists; the program proceeds to step 63 where the reading on CRT 17 is blanked (instead of displaying the voltage value retrieved). Control is then returned to the main program via step 69. As will suggest itself, display indications other than blanking may be performed at step 63.

If the $V_{input}$ voltage is not equal to the stored $V_{off\,zero}$ voltage, as determined in step 61, the program proceeds to step 65 where the display voltage value is calculated as a function of $V_{input}$. The calculated voltage is then displayed in step 67 and control is returned to the main program via step 69.

It should be understood of course that a preferred embodiment of the present invention has been described herein and that modifications or alterations may be made without departing from the spirit or scope of the invention as defined by the following claims.

What is claimed is:

1. An engine analyzing device for analyzing the operational characteristics of an internal combustion engine, comprising:

a test lead electrically connectable to an internal combustion engine for receiving an engine test signal, said test lead developing a disconnect voltage level when said test lead is disconnected from the engine;

a ground lead electrically connectable to the internal combustion engine for providing a ground reference;

signal referencing means interconnected between said test lead and said ground lead for representing said test signal as a voltage signal having a voltage magnitude lying within a predetermined range, said referencing means including:

(i) an output conductor for transmitting said voltage signal as an output voltage signal; and (ii) impedance source means connected to said test lead and establishing a non-zero reference signal as an output voltage signal on said output conductor when said test lead is disconnected from the internal combustion engine, said output voltage signal on said output conductor remaining relatively unaffected by said impedance source means when said test lead is connected to said engine despite the presence of a test signal on said test lead of a voltage level substantially equal to said disconnect voltage level; and signal processing means for receiving said output voltage signal and being responsive to said non-zero reference signal for generating an error indication to the operator.

2. An analyzing device according to claim 1 wherein said impedance source means includes:

voltage source means for providing a voltage level; and a resistive element connected between said voltage source means and said test lead.

3. An analyzing device according to claim 2 wherein said signal referencing means includes resistive means connected between said test lead and said ground lead.

4. An analyzing device according to claim 3 wherein said resistive means includes:

a first resistor connected between said test lead and said output conductors; and a second resistor connected between said output conductor and said ground lead.

5. An analyzing device according to claim 1 wherein said non-zero reference signal is a voltage having a magnitude lying without said predetermined range.

6. An analyzing device according to claim 1 and further including display means electrically connected to said signal processing means, for generating a visual display of analysis information to the operator; and wherein said signal processing means is responsive to said non-zero reference signal for controlling said visual display means for visually displaying an indication that said test lead is disconnected from said internal combustion engine.

7. An analyzing device according to claim 1 wherein said display means displays said analyzing information associated with said test signals at a particular location on said display means; and wherein said processing means controls said display means for blanking said analysis information at said location for indicating that said test lead is disconnected from said internal combustion engine.

8. An analyzing device according to claim 1 wherein said signal processing means stores a value for said non-zero reference signal for comparison with the output voltage signal on said output conductor for determining the occurrence of test lead disconnection.

9. An analyzing device according to claim 8 wherein said signal processing means is responsive to instruction by said operator for updating said value.

10. An analyzing device according to claim 8 wherein said signal processing means establishes a range of values using said value and checks whether said output voltage signal on said output conductor lies within said range of values.

* * * * *